United States Patent

Ashuri

[11] Patent Number: 5,936,867
[45] Date of Patent: *Aug. 10, 1999

[54] METHOD FOR LOCATING CRITICAL SPEED PATHS IN INTEGRATED CIRCUITS

[75] Inventor: Roni Ashuri, Zichron Yaakov, Israel

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/976,439

[22] Filed: Nov. 25, 1997

Related U.S. Application Data

[63] Continuation of application No. 08/616,073, Mar. 14, 1996, abandoned.

[51] Int. Cl.[6] .............................. G06F 17/00; G06F 17/50
[52] U.S. Cl. .......................... 364/490; 364/488; 364/489
[58] Field of Search .................................. 364/488, 489, 364/490, 491; 395/500

[56] References Cited

U.S. PATENT DOCUMENTS

| | | | |
|---|---|---|---|
| 4,940,908 | 7/1990 | Tran | 307/443 |
| 5,095,454 | 3/1992 | Huang | 364/578 |
| 5,455,931 | 10/1995 | Camporese et al. | 395/556 |
| 5,497,263 | 3/1996 | Masuda et al. | 327/278 |
| 5,583,787 | 12/1996 | Underwood et al. | 364/489 |
| 5,608,645 | 3/1997 | Spyrou | 364/491 |

*Primary Examiner*—Kevin J. Teska
*Assistant Examiner*—Vuthe Siek
*Attorney, Agent, or Firm*—Blakely, Sokoloff, Taylor & Zafman

[57] ABSTRACT

A method for locating a critical speed path within a integrated digital circuit. First, the area containing the critical speed path is isolated by selectively enabling a delay of clock driver circuits in the integrated circuit. Isolating the location of the speed path consists of determining a source clock driver that clocks the source of the speed path and a destination clock driver that clocks the destination of the speed path. The possible data path that may be the speed path are then further narrowed down by examining a connection database that lists all the data paths between various circuit areas. Specifically, all the data paths that do not originate at a flip-flop clocked by the source clock driver and end at a flip-flop clocked by the destination clock driver are eliminated. Next, information from a logic simulation trace is examined. The exact time at which the error occurs is identified on the logic simulation trace. At this point, only the source flip-flops that change state during this time period can be related to the speed path. Thus all paths that do not include a changing source flip-flop are excluded from possibility. At this point, the possible suspect data paths that may be the speed path have been reduced to a very small number, possibly one.

8 Claims, 3 Drawing Sheets

| Flip - Flop | Data out-put at the time | | | | | | | |
|---|---|---|---|---|---|---|---|---|
| | $\phi$ | $\phi_{+1}$ | $\phi_{+2}$ | $\phi_{+3}$ | $\phi_{+4}$ | $\phi_{+5}$ | $\phi_{+6}$ | $\phi_{+7}$ |
| FF1 | 0 | 0 | 0 | 0 | 1 | 1 | 1 | 1 |
| FF2 | 0 | 0 | 1 | 1 | 0 | 0 | 0 | 0 |
| FF3 | 0 | 1 | 1 | 1 | 1 | 1 | 1 | 1 |
| FF4 | 1 | 0 | 0 | 0 | 0 | 0 | 1 | 1 |
| FF5 | 0 | 1 | 1 | 1 | 1 | 0 | 0 | 0 |
| FF6 | 1 | 1 | 0 | 0 | 0 | 0 | 0 | 1 |
| FF7 | 1 | 1 | 1 | 1 | 0 | 0 | 1 | 1 |
| FF8 | 0 | 0 | 0 | 1 | 1 | 1 | 1 | 1 |
| FF9 | 1 | 1 | 0 | 0 | 1 | 1 | 1 | 0 |

Fault Occurs

Figure 3

METHOD FOR LOCATING CRITICAL SPEED PATHS IN INTEGRATED CIRCUITS

This is a continuation of application Ser. No. 08/616,073, filed Mar. 14, 1996, now abandoned.

FIELD OF THE INVENTION

The present invention is in the field of digital semiconductor electronic devices. Specifically, the present invention comprises a circuit and method for locating speed critical paths in digital semiconductor devices.

BACKGROUND OF THE INVENTION

Within every digital integrated circuit there will always be one data path between two circuit blocks that requires the longest time to generate the proper output data before the data may be sampled. This occurs due to propagation delays caused by the complex logic circuits between flip-flops. The data path that requires the longest time for the data signal to be generated before it may be sampled is known as the critical "speed path" of the integrated circuit.

The maximum speed that the digital integrated circuit may operate at is limited by the speed path in the digital integrated circuit. The reason for this is that the speed path presents the longest delay path thus the clock rate can not be increased beyond the point where the clock cycle time is equal to the propagation delay of the speed path.

Since the maximum speed of an integrated circuit is limited by the speed path of the integrated circuit, it is very desirable to be able to easily locate the speed path within an integrated circuit. However, in complex modern integrated circuits such as microprocessors there are millions of possible paths that may be the speed path. To locate the speed path among the millions of data paths in the integrated circuit requires sophisticated design and testing tools

SUMMARY AND OBJECTS OF THE INVENTION

It is desirable to be able to locate the critical speed path in an integrated circuit that limits the speed at which the integrated circuit may perform. A method of locating such critical speed paths with integrated circuit debugging tools is presented. First, it is best to generally locate the area that contains the critical speed path. This can be performed by providing some clock driver circuits within the integrated circuit must have with a controllable delay circuit that can delay the local clock signal. By selectively enabling the delay circuit within clock driver circuits, critical speed paths can be isolated to a certain area within the microprocessor. Isolating the location of the speed path in this manner will provide a source clock driver that clocks the source flip-flop of the speed path and a destination clock driver that clocks the destination flip-flop of the speed path.

The possible data paths that may be the speed path are then further narrowed down by examining a connection database that lists all the data paths between various circuit areas. Specifically, all the data paths that do not originate at a flip-flop clocked by the source clock driver and end at a flip-flop clocked by the destination clock driver are eliminated from contention.

Finally, information from a logic simulation trace is examined. The exact time at which the error occurs is identified on the logic simulation trace. At this point, only the source flip-flops that change state during this time period can be related to the speed path. Thus all paths that do not include a changing source flip-flop are excluded from possibility. At this point, the possible suspect data paths that may be the speed path have been reduced to a very small number, possibly one.

BRIEF DESCRIPTION OF THE DRAWINGS

The objects, features, and advantages of the present invention will be apparent from the following detailed description of the preferred embodiment of the invention with references to the following drawings.

FIG. 3 illustrates an output from a logic simulation trace.

DETAILED DESCRIPTION

A method for locating critical speed paths within digital integrated circuits is disclosed. In the following description, for purposes of explanation, specific nomenclature is set forth to provide a thorough understanding of the present invention. However, it will be apparent to one skilled in the art that these specific details are not required in order to practice the present invention. In other instances, well known circuits and devices are shown in block diagram form in order not to obscure the present invention.

Critical Speed Path

Within a digital integrated circuit, data is often shared between the various logic circuits. The various logic circuits are connected to each other through defined data paths. For example, in FIG. 1 data path 187 carries information from flip-flop 7 (FF7) to flip-flop 33 (FF33). If the logic circuitry 175 between flip-flop 7 and flip-flop 33 is sufficiently complex, a long propagation delay might be introduced causing the information that will be placed on data path 187 to be sampled before it is ready. If the speed of the clock driving the integrated circuit is increased beyond the propagation delay of the slowest data path, then the receiving flip-flop may sample the data before the data is propagated through the data path logic. In such a situation, the receiving flip-flop will receive incorrect data.

Within every digital integrated circuit, there is always one data path between two circuit blocks that requires the longest time to generate the proper output data before it may be sampled. The data path that requires the longest time for the data signal to be generated before it may be sampled is known as the critical "speed path". The maximum speed that the digital integrated circuit may operate at is limited by this speed path. To improve the performance of a digital integrated circuit, a designer must first be able to locate the speed path.

Figure 1:
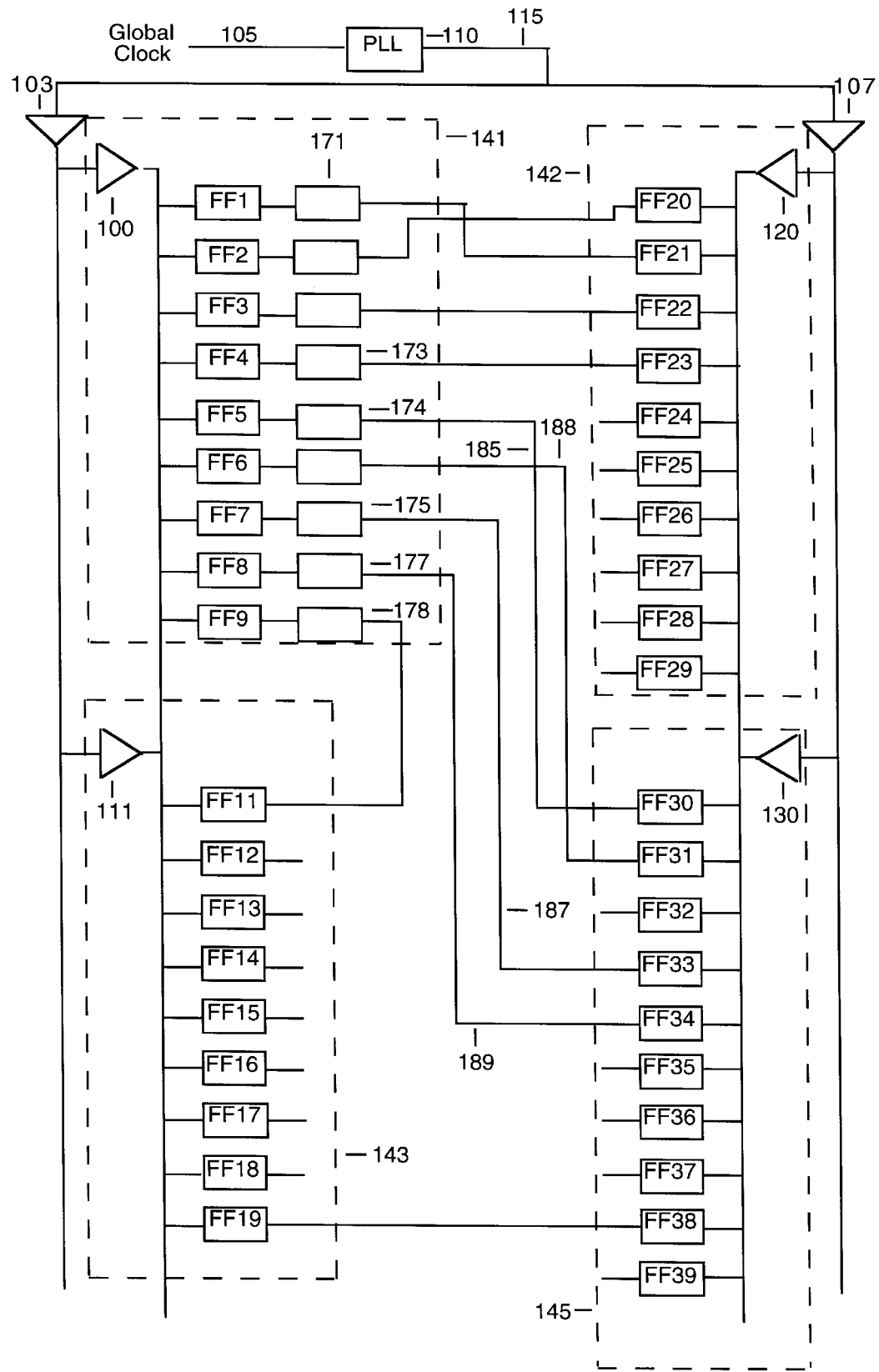
FIG. 1 illustrates a block diagram of a highly integrated digital integrated circuit.

After locating the speed path, the inefficient logic that is causing the speed path may be simplified or moved such that it is no longer the slowest path in the digital integrated circuit. The present invention introduces methods that simplify the task of locating the critical speed path within a digital integrated circuit. cl Localizing A Speed Path With A Delay Controlled Clock Driver FIG. 1 illustrates a block diagram of a typical clock distribution system for use within a digital integrated circuit. An external clock signal driven by a crystal or other means is introduced into the integrated circuit on line 105. The external clock line 105 enters a phase lock loop circuit 110 or other clock generator that drives a main clock signal 115 within the integrated circuit.

The digital integrated circuit of FIG. 1 is divided into several circuit subblocks. Each circuit subblock provides some functionality for the integrated circuit. The main clock signal 115 is distributed to several subblock clock drivers (103 and 107) that drive the clock signal within the various circuit subblocks. The subblock clock drivers (103 and 107) strengthen the clock line signal in order to drive a large fan-out of local circuits within each subblock.

Within each subblock are several local block circuits (141, 142, 143, and 145). The strengthened clock line is supplied to a local clock driver (100, 120, 111, and 130) within each local block (141, 142, 143, and 145 respectively). Each local clock driver drives a clock signal for the circuits within its local block circuit.

Figure 2:
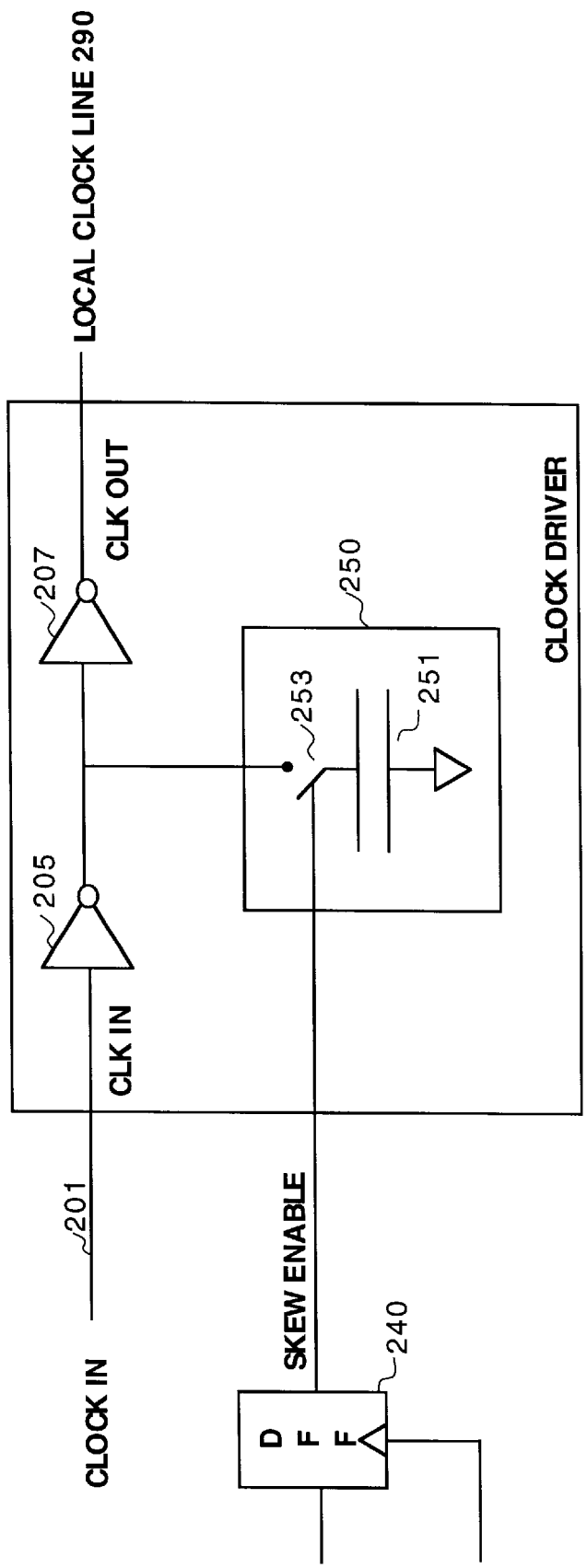
FIG. 2 illustrates a circuit diagram of a clock driver with a controllable delay.

To initially limit the possible data paths that are causing a speed path, it is recommended that the designers have controllable clock driver circuits that can introduce delays onto the clock line within a subblock or a local block. FIG. 2 illustrates one possible implementation of a local clock driver for use with the present invention.

The clock driver of FIG. 2 comprises in part two (or more) inverters 205 and 207 that are in series. However, the clock driver of FIG. 2 also includes a delay circuit 250. The embodiment of FIG. 2 consists of delay circuit 250 comprising a switch 253 and a capacitor 251. Other types of known delay circuits can also be used. The switch 253 is controlled by a D flip-flop 240. The D flip flop 240 controls whether the skew enable is turned on or off. When the skew is disabled, the clock driver of FIG. 2 behaves like a normal clock driver. However, when the switch 253 is turned on, the line between the two inverters 205 and 207 is connected through capacitor 251 to ground. When the line between inverter 205 and inverter 207 is connected through capacitor 251 to ground, additional time is required to build up charge before the signal is propagated by inverter 207. Thus, when the skew enable line is asserted, a delay will be added to the clock signal that passes through the clock driver circuit of FIG. 2.

If a number of the clock drivers in a digital integrated circuit contains the skew circuit of FIG. 2 then the critical "speed path" of the digital integrated circuit can be localized. To localize the critical speed path the following steps are performed:

Step 1. Slowly increase the clock speed of the digital integrated circuit until the digital integrated circuit fails. This speed exceeds the limits of the critical speed path.

Step 2. Turn on the skew enable for one clock driver in the digital integrated circuit and then test the digital integrated circuit.

Step 3. If the digital integrated circuit now functions properly, then you have located the clock driver that clocks the receiving flip-flop of the critical speed path. Otherwise, turn on the skew enable for a different local clock driver in the digital integrated circuit and return to Step 2.

Step 4. Having identified the receiving clock driver and flip-flop of the critical speed path, the source clock driver and source flip-flop of the critical speed path must be found. Keeping the skew enable on for the receiving clock driver, turn on the skew enable for another clock driver that clocks a flip-flop that sends data signals to the receiving flip-flop.

Step 5. If the digital integrated circuit now malfunctions, then you have located the source clock driver and source flip-flop of the critical speed path. Otherwise, turn on the skew enable for a different clock driver that clocks a flip-flop that sends data signals to the receiving flip-flop and return to Step 4 until the source clock driver and flip-flop is found.

A more complete description of the method used to localized the speed path can be found in copending patent application entitled "Method And Apparatus For Locating And Improving Critical Speed Paths In VLSI Integrated Circuits", Ser. No. 08/537,092, filed Sep. 29, 1995 now U.S. Pat. No. 5,705,942. As specified in the steps above, a person debugging an integrated circuit with the improved local clock drivers must be able to turn the skew enable on and off for all the various local clock drivers. Thus, the digital integrated circuit must be designed such that the skew enable for the local clock drivers are independently addressable.

After following the previously described steps, both the source block and the destination block of the speed path have been located. However, there still many be a large number of data paths that could be the speed path. For example, referring to FIG. 1, if the speed path was localized to be somewhere between the flip-flops clocked by clock driver 103 and the flip-flops clocked by clock driver 107, there would still be a large number of data paths that may be the cause of the speed path.

After localizing the area that contains the speed path, integrated circuit designers can further narrow down the location of the speed path by using a set of integrated circuit design and testing tools.

Connection Database Look Up

To facilitate the design of complex integrated circuits many computer aided design tools are used. The computer aided design tools store information that defines every aspect of the designed integrated circuit. One of the databases is a connection database that contains all the connections between various flip-flops. The information in this database can be used to help locate a speed path within a digital integrated circuit.

After localizing the area that contains the speed path as described in the previous section, both the source clock driver that clocks the source of the speed path and a destination clock driver that clocks the destination of the speed path are known. To narrow down the possible data paths that may be the speed path, the connection database is searched to locate all suspect data paths that originate at a flip-flop clocked by the source clock driver and terminate at a flip-flop clocked by the destination clock driver. These suspect data paths are the only possible paths that may be the speed path.

For example, referring to FIG. 1 suppose that a speed path has been localized such that it is known to originate at a flip-flop clocked by clock driver 100 and terminates at a flip-flop clocked by clock driver 130. By examining the connection database, it can be determined that the speed path must be data path 185, data path 187, data path 188, or data path 189 since those are the only data paths that connect source flip-flops clocked by clock driver 100 to destination flip-flops clocked by clock driver 130.

Using Simulation Tools to Help Locate the Speed Path

After reducing the possible data paths that may be the speed path by using the connection database, another design tool is then used to further reduce the possible suspect paths. Specifically, a logic simulation trace is examined.

When designing a complex integrated circuit, the entire integrated circuit is simulated on a computer before it is committed to silicon. The integrated circuit is simulated such that the output of every flip-flop during every clock cycle is known. FIG. 3 illustrates an example of some information from a logic simulation. In FIG. 3, time proceeds from left to right. The rows represent the state of various flip-flops during consecutive clock cycles.

To help locate the speed path, the exact time at which the speed path error occurs is identified on the logic simulation trace. In the example of FIG. 3, the speed path error occurs after clock cycle Φ+5.

Speed path related errors occur when the source flip-flop changes its output before it has been sampled properly by the destination flip-flop. Thus, only those source flip-flops that change state at the time the error occurred can be related to the speed path. Therefore, all data paths that do not include a changing source flip-flop are excluded from possibility.

Referring back to FIG. 3, between clock cycle Φ+5 and clock cycle Φ+6, only flip-flop 4 and flip-flop 7 change state. Assuming that the source clock driver is clock driver 100 and the destination clock driver is clock driver 130, data path 173 coupled to flip-flop 4 can not be the speed path. The reason for this is that data path 173 does not connect to a destination flip-flop clocked by the destination clock driver 130 and thus has already been eliminated as the possible speed path by the previous step. Thus, the speed path must be data path 187 since it originates with a flip-flop clocked by the source clock driver, it terminates at a flip-flop clocked by the destination clock driver, and it is the only of such data paths that has its source flip-flip change state when the error occurs.

Note that even if one uses the methods of the present invention, the exact path will not be determined in every case. However, the techniques of the present invention will reduce the number of possible suspect data paths that may be the speed path to a very small number. This small number of suspect data paths can be redesigned to remedy the speed path.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A method of narrowing a location of a critical speed path in an integrated circuit, said method comprising:

localizing an area of a speed path to determine a source clock driver that clocks a source of said speed path and a destination clock driver that clocks a destination of said speed path;

creating a list of suspect data paths by examining a data path database to locate data paths that originate at a flip-flop clocked by said source clock driver and terminate at a flip-flop clocked by said destination clock driver;

performing a logic simulation of said integrated circuit to generate a logic simulation trace of said integrated circuit;

examining said logic simulation trace of said integrated circuit to locate a clock cycle wherein a critical speed path fails;

identifying all flip-flops coupled to said source clock driver that changes state during said clock cycle when said critical speed path fails;

locating a subset of suspect data paths from said list of suspect data paths; and excluding all data paths that do not include a source flip-flop that changes state during said clock cycle wherein said critical path failure occurred from said subset of data paths from said list of suspect data paths.

2. The method of locating a critical speed path in an integrated circuit as claimed in claim 1 wherein performing a logic simulation of said integrated circuit comprises:

simulating each circuit element within said integrated circuit; and successively stepping through a series of clock cycles such that the behavior of said integrated circuit is fully documented.

3. The method of locating a critical speed path in an integrated circuit as claimed in claim 1 wherein localizing the area of a speed path comprises:

selectively delaying source clock drivers and destination clock drivers on said integrated circuit to determine said source clock drivers that clock said source of said speed path and said destination clock drivers that clock a destination of said speed path.

4. A method of narrowing a location of a critical speed path in an integrated circuit, said method comprising:

localizing an area of a speed path to determine a source clock driver that clocks a source of said speed path and a destination clock driver that clocks a destination of said speed path;

creating a list of suspect data paths by examining a data path database to locate data paths that originate at a flip-flop clocked by said source clock driver and terminate at a flip-flop clocked by said destination clock driver;

performing a logic simulation of said integrated circuit to generate a logic simulation trace of said integrated circuit; and examining said logic simulation trace of said integrated circuit to locate a subset of suspect data paths from said set of suspect data paths wherein the source flip-flop clocked by said source clock driver changes state at a time the critical speed path fails; and excluding from said subset of suspect data paths all data paths that do not include a source flip-flop that changes state during said clock cycle where said critical path failure occurred.

5. The method of locating a critical speed path in an integrated circuit as claimed in claim 4 wherein localizing the area of a speed path comprises:

selectively delaying source clock drivers and destination clock drivers on said integrated circuit to determine said source clock driver that clocks said source of said speed path and a destination clock driver that clocks a destination of said speed path.

6. A method of narrowing a location of a critical speed path in an integrated circuit, said method comprising:

localizing an area of a speed path to determine a source clock driver that clocks a source of said speed path and a destination clock driver that clocks a destination of said speed path;

performing a logic simulation of said integrated circuit to generate a logic simulation trace of said integrated circuit;

creating a list of suspect data paths by examining said logic simulation trace of said integrated circuit to locate data paths wherein a source flip-flop clocked by said source clock driver changes state at a time a critical speed path fails; and excluding from said list of suspect data paths all data paths that do not include a source flip-flop that changes state during said clock cycle where said critical path failure occurred.

7. The method of locating a critical speed path in an integrated circuit as claimed in claim 6 wherein performing a logic simulation of said integrated circuit comprises:

simulating each circuit element within said integrated circuit; and successively stepping through a series of clock cycles such that the behavior of said integrated circuit is fully documented.

8. The method of locating a critical speed path in an integrated circuit as claimed in claim 6 wherein examining said logic simulation trace comprises:

locating a clock cycle wherein said critical speed path fails; and identifying all flip-flops coupled to said source clock driver that change state during said clock cycle wherein said critical speed path fails.

* * * * *